(12) United States Patent
Poon et al.

(10) Patent No.: US 8,860,142 B2
(45) Date of Patent: Oct. 14, 2014

(54) METHOD AND APPARATUS TO REDUCE THERMAL VARIATIONS WITHIN AN INTEGRATED CIRCUIT DIE USING THERMAL PROXIMITY CORRECTION

(71) Applicant: Globalfoundries Singapore Pte. Ltd., Singapore (SG)

(72) Inventors: Debora Chyiu Hyia Poon, Singapore (SG); Alex K H See, Singapore (SG); Francis Benistant, Singapore (SG); Benjamin Colombeau, Salem, MA (US); Yun Ling Tan, Singapore (SG); Mei Sheng Zhou, Singapore (SG); Liang Choo Hsia, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/648,905

(22) Filed: Oct. 10, 2012

(65) Prior Publication Data
US 2013/0099321 A1   Apr. 25, 2013

Related U.S. Application Data

(63) Continuation of application No. 12/220,792, filed on Jul. 28, 2008, now Pat. No. 8,293,544.

(51) Int. Cl.
*H01L 21/70* (2006.01)
*H01L 27/088* (2006.01)
*H01L 27/02* (2006.01)

(52) U.S. Cl.
CPC .......... *H01L 27/088* (2013.01); *H01L 27/0211* (2013.01)
USPC 257/368; 257/390; 257/E27.06; 257/E27.081

(58) Field of Classification Search
USPC .............................. 257/390, E27.06
See application file for complete search history.

(56) References Cited

U.S. PATENT DOCUMENTS

| | | | |
|---|---|---|---|
| 4,417,822 A | 11/1983 | Stein et al. | |
| 4,956,538 A | 9/1990 | Moslehi | |
| 5,166,080 A | 11/1992 | Schietinger et al. | |
| 5,336,641 A | 8/1994 | Fair et al. | |
| 5,624,190 A | 4/1997 | Joseph et al. | |
| 5,756,369 A | 5/1998 | Aronowitz et al. | |
| 6,200,634 B1 | 3/2001 | Johnsgard et al. | |
| 7,537,941 B2 * | 5/2009 | Anderson et al. | 438/14 |
| 2001/0040156 A1 | 11/2001 | Tay et al. | |
| 2002/0019148 A1 | 2/2002 | Hawryluk et al. | |
| 2003/0036877 A1 | 2/2003 | Schietinger | |
| 2003/0226757 A1 * | 12/2003 | Smith et al. | 205/82 |
| 2004/0188801 A1 * | 9/2004 | Ehrichs | 257/532 |
| 2007/0202652 A1 | 8/2007 | Moroz et al. | |
| 2007/0202662 A1 | 8/2007 | Lin et al. | |
| 2007/0287200 A1 * | 12/2007 | Anderson et al. | 438/7 |

* cited by examiner

*Primary Examiner* — Lex Malsawma
(74) *Attorney, Agent, or Firm* — Robert D. McCutcheon

(57) ABSTRACT

A method (and semiconductor device) of fabricating a semiconductor device utilizes a thermal proximity correction (TPC) technique to reduce the impact of thermal variations during anneal. Prior to actual fabrication, a location of interest (e.g., a transistor) within an integrated circuit design is determined and an effective thermal area around the location is defined. Thermal properties of structures intended to be fabricated within this area are used to calculate an estimated temperature that would be achieved at the location of interest from a given anneal process. If the estimated temperature is below or above a predetermined target temperature (or range), TPC is performed. Various TPC techniques may be performed, such as the addition of dummy cells and/or changing dimensions of the structure to be fabricated at the location of interest (resulting in an modified thermally corrected design, to suppress local variations in device performance caused by thermal variations during anneal.

20 Claims, 3 Drawing Sheets

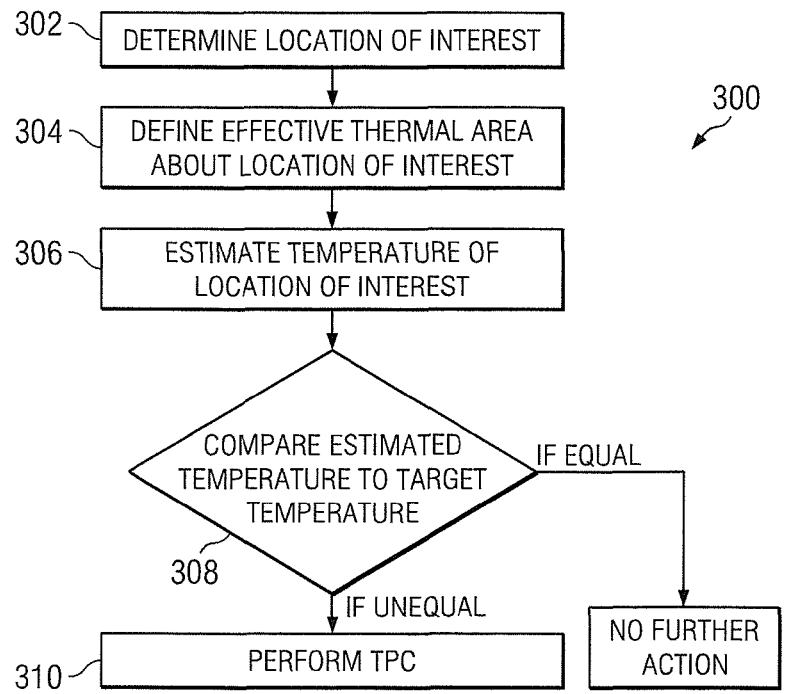
FIG. 3
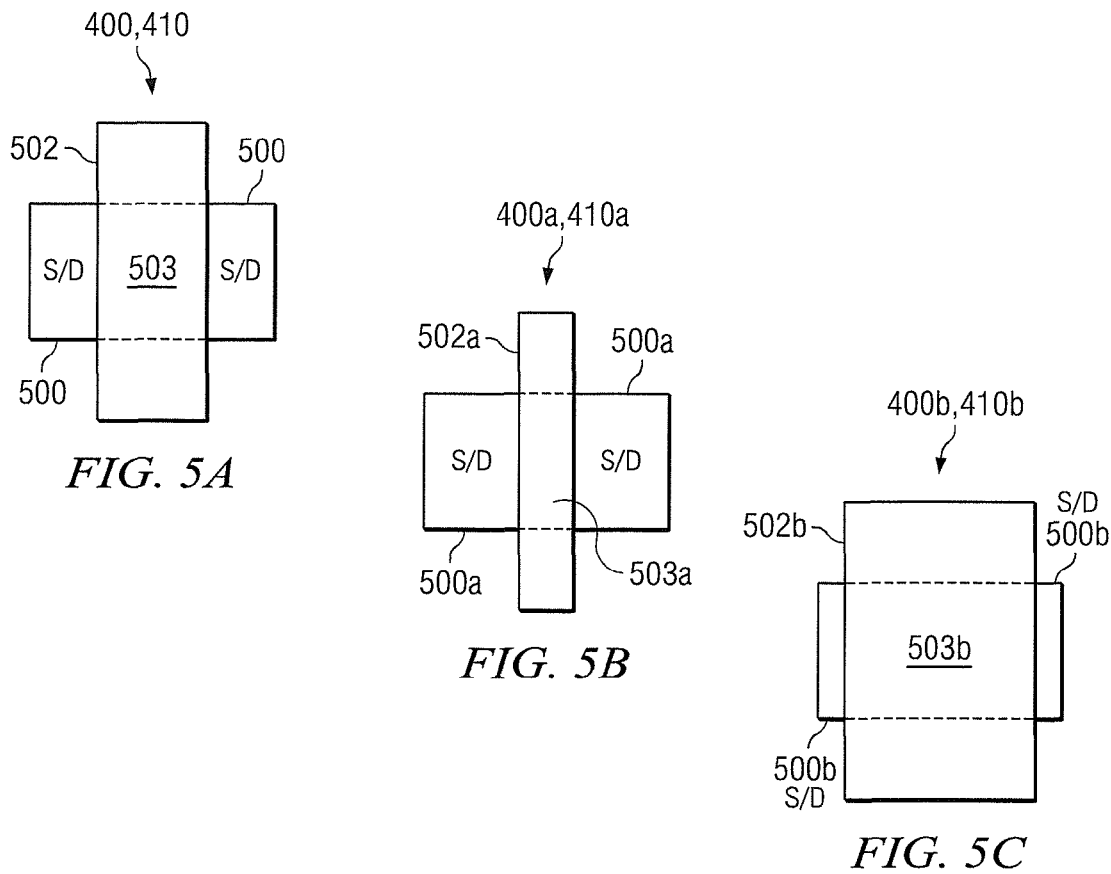
FIG. 5A
FIG. 5B
FIG. 5C

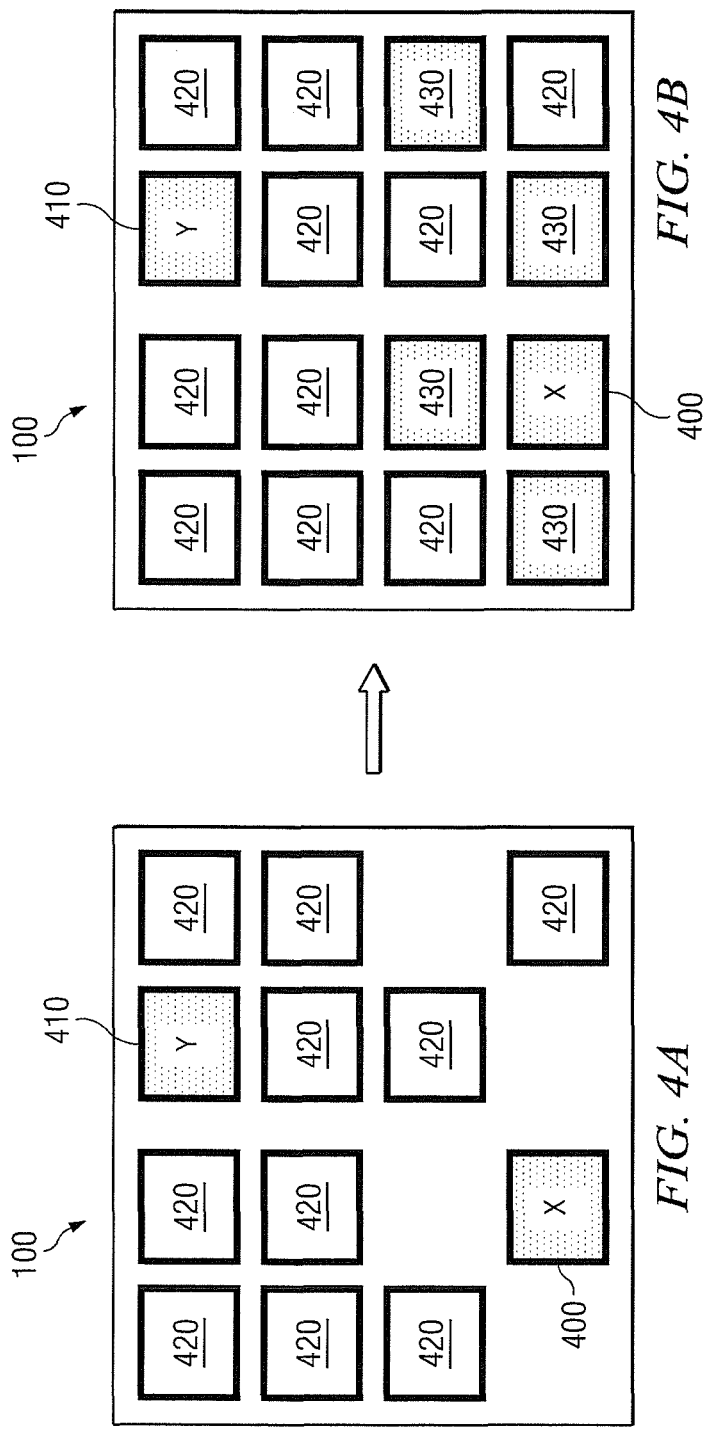

METHOD AND APPARATUS TO REDUCE THERMAL VARIATIONS WITHIN AN INTEGRATED CIRCUIT DIE USING THERMAL PROXIMITY CORRECTION

CROSS-REFERENCE TO RELATED APPLICATION(S)

The present application is a divisional of U.S. patent application Ser. No. 12/220,792 filed Jul. 28, 2008

TECHNICAL FIELD

The present disclosure relates generally to devices and methods of fabrication of semiconductor devices, and more particularly to the fabrication of integrated circuits and reducing temperature variation (and its effects) within a semiconductor integrated circuit die.

BACKGROUND

In conventional semiconductor integrated circuit processing, various front-side annealing techniques, such as rapid thermal processing (RTP), flash lamp (FL) and laser spike annealing (LSA), are commonly utilized to activate dopants and remove defects for ultra-shallow ion-implanted junctions. During performance of these annealing processes, temperature variations occur at different points or areas within the integrated circuit die. Temperature variations within a die are due primarily to differences in thermal absorption and emission caused by different film stacks at different locations. Various publications have shown that different materials on the front-side give rise to emissivity variations that can lead to significant local variations in temperature (e.g., incident light is absorbed/reflected differently depending on film composition).

At larger device dimensions, these temperature variations have little or no effect. However, as device dimensions shrink, the impact of these temperature variations has an increased effect on device performance by affecting electrical response. Variations in device performance within a die have been observed and are attributed to temperature non-uniformity when the wafer (and its dies) undergoes front-side annealing schemes. These temperature variations not only result from differences in film stack materials, but also result from the pattern density across the die. In addition, when annealing duration is reduced, diffusion lengths are similarly reduced which leads to increased temperature non-uniformity.

Accordingly, there is a need for an improved fabrication process (and resulting devices) that reduces temperature variations within an integrated circuit die and/or minimizes their impact on device performance.

SUMMARY

In accordance with one embodiment, there is provided method of forming an integrated circuit die. The method includes determining a location of interest within an integrated circuit design and defining an effective thermal area for the location of interest. An effective temperature is estimated at the location of interest based on a given anneal process to be performed and compared to a target temperature associated with the given anneal process. Thermal proximity correction is performed when the estimated effective temperature does not meet the target temperature.

In accordance with another embodiment, there is provided an integrated circuit die comprising a device structure formed at a pre-determined location on the die, and one or more dummy structures formed within a pre-defined effective thermal area surrounding the transistor structure and operable for purposely affecting temperature at the pre-determined location during a thermal anneal process.

In yet another embodiment, there is provided a method of designing an integrated circuit to reduce thermal variations generated within the integrated circuit die during an anneal process. The method includes providing an initial integrated circuit design including a transistor with source/drain regions. An effective thermal area about the transistor is defined and an effective temperature at the location the transistor is estimated based on a given anneal process intended to be performed during fabrication of the integrated circuit die based on the initial integrated circuit design. The estimated effective temperature is compared to a target temperature associated with the given anneal process and, if the estimated effective temperature does not meet the target temperature, the integrated circuit design is modified to incorporate thermal proximity correction.

In another embodiment, there is provided a method of fabricating an integrated circuit die. The method includes providing an initial integrated circuit design, performing a thermal proximity correction process on the initial integrated circuit design to reduce thermal variations in a predetermined thermal anneal process during fabrication of the integrated circuit die, modifying the initial integrated circuit design to generate a modified integrated circuit design, and fabricating the integrated circuit in accordance with the modified integrated circuit design.

In still another embodiment, there is provided an integrated circuit die comprising a first transistor structure formed at a first pre-determined location on the die, the first transistor structure having source/drain regions, a gate electrode and a channel region, and a second transistor structure formed at a second pre-determined location on the die, the second transistor structure having source/drain regions, a gate electrode and a channel region. At least one dimension of the second transistor structure is substantially different from a corresponding dimension of the first transistor structure and the performance of the first transistor structure and the performance of the second transistor structure is substantially uniform as a result of temperature variation at the first and second transistor structures during annealing.

Other technical features may be readily apparent to one skilled in the art from the following figures, descriptions, and claims.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which:

FIG. 3 illustrates a process 300 for determining whether thermal proximity correction should be performed for a given location of interest within an integrated circuit die;

FIG. 4A is a block diagram illustrating an integrated circuit die 100;

FIG. 4B illustrates the integrated circuit die shown in FIG. 4A with added dummy structures;

FIG. 5A illustrates source/drain region and channel geometries of two transistors shown in FIG. 4A; and FIGS. 5B and 5C illustrate examples of possible modifications to the two transistor geometries shown in FIG. 4A.

DETAILED DESCRIPTION

The present disclosure introduces various devices and methods to minimize or suppress local temperature variations (and the effects of such variations) within an integrated circuit die. These devices and methods may be implemented throughout the fabrication process (and methods implemented in the design process prior to actual fabrication in), and may be introduced or performed at mask level during reticle design. These devices and methods may be generally described, either individually or collectively, as thermal proximity correction.

The overall method(s) of the present disclosure may be generally described as determining or defining an effective thermal area around a given location (within a given integrated circuit design) and identifying the thermal properties of structures within the effective thermal area that will impact temperature at the given location (during the annealing process). An effective (estimated) temperature at the given location is calculated based on the identified thermal characteristics exhibited within the defined effective thermal area. If the estimated temperature is less than or greater than a pre-defined target temperature (or range of temperature), one or more thermal proximity correction techniques are implemented. In one embodiment, dummy structures are added to the integrated circuit die at specified locations. In another embodiment, device structures are modified to account for the local temperature variation. As will be appreciated, a combination of both embodiments may also be implemented.

Figure 1:
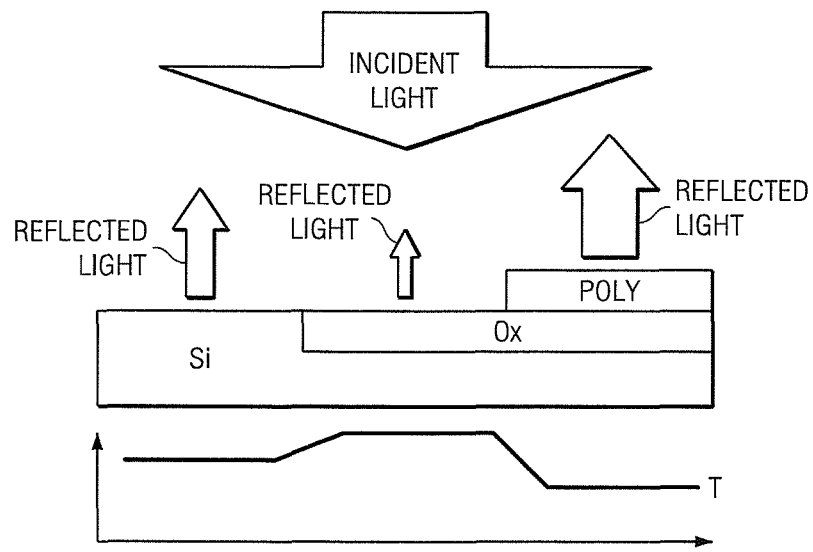
FIG. 1 is a diagram illustrating thermal variations across different types of materials on an integrated circuit die.

Referring to FIG. 1, there is depicted a diagram illustrating thermal variations across different types of materials on an integrated circuit die. As illustrated, different film materials typically present on an integrated circuit die reflect/absorb incident light differently. As shown using three conventional film materials (silicon, oxide, and polysilicon) as an example, each material absorbs a given amount of incident light, and thus, correspondingly reflects light. Absorption of more light results in a higher temperature within the material. Thus, a structure having different materials subject to the applied light results in non-uniform temperature variations within the die at different points or locations.

The diagram positioned below the example die cross-section illustrates the effective temperature T of the different materials in response to a given amount of incident light. The temperature T is the temperature at a given point in the silicon substrate (or other type of semiconductor substrate) below the surface of each material. Temperature variation is due mainly to different thermal absorption and emission characteristics of the materials. As described previously, various annealing techniques (e.g., RTP, Flash, LSA) are utilized for dopant activation and defect removal in shallow junction, or for some other desired function related to diffusion and diffusion junctions (i.e., junction engineering). These techniques utilize light in order to raise the temperature of the die to provide the desired annealing result, e.g., dopant activation, out diffusion, defect removal in diffusion junctions, and the like.

Figure 2:
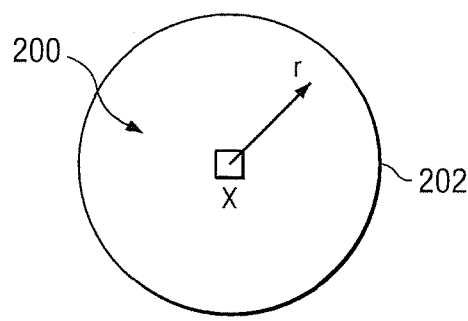
FIG. 2 depicts a location X representing a location within an integrated circuit die and an effective thermal radius r beyond which thermal effects are assumed to be negligible.

Now referring to FIG. 2, there is illustrated a location X representing a location within an integrated circuit die. For example, the location X may represent any type of semiconductor device structure (or structures), such as a transistor structure. In one embodiment, an effective thermal area 200 surrounding location X is defined by the circle 202 having radius r.

Though the effective thermal area 200 is shown as a circle with radius r, the area about location X may take other shapes and is not limited to a circular area. In general, the effective thermal area 200 about location X is defined as an area within which thermal properties (e.g., emissivity, absorption coefficient, reflectivity) will substantially affect or impact the temperature of location X (during the above-described annealing process(es). Thus, beyond the radius r thermal effects are assumed to be negligible. In addition, the shape and extent of the effective thermal area 200 may also depend on other structural factors (e.g., proximity to the edge of a die, or composition of other types of adjacent structures, etc.). As will be appreciated, the shape, dimensions and extent of the effective thermal area 200 may vary.

Now referring to FIG. 3, there is shown a process 300 for determining whether thermal proximity correction should be performed for a given location of interest (e.g., location X) within an integrated circuit die 100. The location of interest is determined (step 302) and the effective thermal area 200 about the location of interest is defined or determined (step 304). The effective thermal area 200 is an area within which thermal properties (e.g., emissivity, absorption coefficient, reflectivity) of the stack material will substantially affect or impact the temperature of the location of interest (during the above-described annealing process(es). As an example, radius r is a function of properties of thermal conduction, annealing temperature and duration of annealing. The types and composition of stack materials may vary, and may be any materials utilized in the fabrication of integrated circuits, as is known to those skilled in the art. Calculation of the thermal conduction of such materials is a function of temperature and material-dependent properties, as readily understood.

With knowledge of both the topology of the structures and stack materials within the effective thermal area 200 (to be formed in the integrated circuit die 100) and their various thermal characteristics, the effective (or estimated) temperature of the location of interest is calculated (step 306). This may be implemented using 2D/3D simulation of thermal absorption and thermal conduction within the area 200. As will be appreciated, different materials exhibit different absorption and thermal conduction characteristics. Those of ordinary skill in the art may readily ascertain these characteristics for typical materials and device structures that would be formed within the area 200. The dimensions, shapes and thermal conduction properties of the material film stacks on the underlying semiconductor substrate within the effective thermal area are factors that affect the calculation of the effective temperature of the location of interest.

For example, the integrated circuit design for the die 100 is known prior to actual fabrication. From this, the overlying topology of materials (type and dimensions) that will be formed and exist on the die 100 (and within area 200) at the time of performing the annealing process(es) is also known. This information may be extracted from the underlying integrated circuit design information (e.g., design files) and utilized for the calculations. While these calculations could be performed manually based on the topology information on individual locations of interest, a software application or program (i.e., simulation) may be developed by a person of skill in the art to extract the necessary information and perform the calculations.

The calculated effective (estimated) temperature of the location of interest is compared to a pre-defined target temperature or range of target temperatures (step 308). If the estimated temperature falls outside the pre-defined target temperature range (or below a threshold and/or above a threshold), an action is performed to reduce the impact of this variation in temperature from the target temperature (step 310). Such an action or process may be referred to as thermal proximity correction (TPC). In response to TPC, the actual temperature of the location of interest should reach the desired target temperature (or range) during annealing. This effectively eliminates or reduces the potential impact of the temperature variation on the device at the location of interest. If the estimated temperature falls within the target range (or meets the proper threshold), no further action is necessary for the particular location of interest.

As will be appreciated, the process 300 provides for a method of designing an integrated circuit. Prior to step 302, an original integrated circuit design is provided or generated. From this design, the location of interest within the design is identified and the noted steps are performed. Performance of the TPC process (step 310) includes modifying the original integrated circuit design (as described in more detail below) to generate a thermal proximity corrected integrated circuit design (i.e., a modified design), and fabricating an integrated circuit including, or in accordance with, the modified design having thermal proximity correction. Understandably, this process may be performed across the entire die or within one or more selected areas of the integrated circuit design. Thus, there may exist multiple different locations of interest and the method or process 300 may be performed for each location of interest.

The target temperature is the temperature desired during the annealing process intended to accomplish the annealing result. The defined temperature range (or single threshold) will usually be dependent on the electrical response sensitivity for a particular product. This sensitivity varies from product to product (e.g., a temperature range of +/−3 degrees Celsius variation might have minimal device impact for one product, but this may lead to a few % variation in device performance in another product thus the range may be tighter for the other product). As will be appreciated, the threshold for initiating TPC may be a single threshold that is slightly below (or above) a specified target temperature. Target temperature(s) depend on the anneal process implemented (and are readily known to those in the art). As will be appreciated, the threshold may be the actual target temperature(s) or some percentage thereof.

The location of interest may be a specific point or may be a point somewhere within a small area corresponding to a given structure to be eventually formed on the integrated circuit die. For example, one location of interest may be within the area encompassing source/drain and/or channel regions of a field-effect transistor (FET).

While any methods or means that result in TPC for an integrated circuit die may be performed in accordance with the teachings of the present disclosure, two specific example embodiments of TPC are described below.

In one embodiment, the TPC is implemented by adding one or more dummy structures within the effective thermal area 200. The added dummy structure(s) assist in thermal absorption and conduction such that the resulting temperature at the location of interest reaches the target temperature during annealing. These structures are added purposely to affect temperature at the location of interest during anneal, and these structures are electrically inactive (i.e., have no affect on the operation of the underlying electrical circuits within the integrated circuit). The type, shape and dimensions of the dummy structure(s) are determined based on known thermal properties of these characteristics, and may be determined by simulation.

Now turning to FIG. 4A, there is illustrated the integrated circuit die 100 (original design for fabrication). The die 100 includes a first transistor structure X (reference numeral 400) and a second transistor structures Y (reference numeral 410). Additional structures 420 may also be provided. These structures 400, 410, 420 represent structures that would be fabricated within the die 100 in accordance with an initial or original integrated circuit design.

Transistor X and transistor Y (if fabricated) are substantially identical transistors, but have varying performance due to differences in the pattern density within each transistor's respective thermal conductive area (see, FIG. 2 and accompanying description). Transistor X exhibits a different transistor performance as compared to transistor Y due to the temperature of the transistor structure (e.g., diffusion regions) not achieving a target temperature during the anneal process. This may result from the various structure(s) and materials within transistor X's effective thermal area preventing attainment of the desired target temperature during anneal.

It will be understood that while transistor X is described as having degraded performance as compared to transistor Y, the transistor Y may exhibit the degraded performance as compared to transistor X (or both transistor X and transistor Y may exhibit degraded performance as compared to some other transistor structure). However, for illustrative purposes and the example described herein, the transistor X has a degraded performance. As will be appreciated, the process 300 of FIG. 3 has been performed and the estimated temperature of the location of interest (transistor X) would not meet the target temperature for the given anneal process. As a result, TPC is performed.

Now turning to FIG. 4B, there is illustrated the integrated circuit die 100 as set forth in FIG. 4A but with the inclusion of dummy structures 430 within the effective thermal area of transistor X. Depending on its type, shape and dimensions (which may vary), each dummy structure 430 will have a "thermal signature" or predetermined thermal properties that can be advantageously used to fabricate an integrated circuit with dummy structure(s) to reduce the impact of temperature variations on device performance (of active structures). The dummy structure(s) could be as simple as an area of oxide or other material, or may be dummy transistor structures similar to the structures surrounding transistor Y (or may resemble the underlying structure(s) of structures surrounding transistor Y that exist at the time of annealing, e.g., not a complete transistor). In any embodiments, the dummy structure(s) fabricated within the effective thermal area of transistor X provide a desired structure that assists in achieving a temperature at transistor X that meets the desired target temperature of an applied anneal process. Thus, an original integrated circuit design undergoes the process 300, and if TPC is necessary, the design is modified to include one or more dummy structures 340 within the thermal area of transistor X, and the integrated circuit is fabricated with the added dummy structure(s).

The dummy structure(s) 430 change the pattern density around transistor X to more closely resemble the pattern density around transistor Y. This results in a more uniform performance of the transistors X, Y. The introduction of the dummy structures 430 assists in providing for a more uniform pattern density, which results in a more uniform device performance of active structures. In other words, the dummy structure(s) 430 are thermal conduction modifying structures that modify the thermal properties of a given area (200) within the die 100 that increase the temperature achieved at the location of interest (location X) during the anneal process (that would not otherwise be attainable with the current integrated circuit design).

In an alternative embodiment of TPC, one or more dimensions of transistor X and/or transistor Y may be modified to account for the local temperature variation. In this embodiment, the no dummy structures are introduced, and the design of the degraded transistor structure is modified and fabricated with the modified dimension(s). Thus, an original integrated circuit design undergoes the process 300, and if TPC is necessary, the design dimensions of the transistor (i.e., at the location of interest) is modified prior to fabrication. Various dimensions that may be changes include transistor gate length and/or width.

To compensate for device variations due to temperature variations during anneal (providing more uniform device operation), transistor X or transistor Y may be modified, or both may be modified. Now turning to FIG. 5A, there is illustrated the original geometries of transistors X and Y (400, 410) having source/drain regions 500 and a gate electrode 502 with a gate 503. Now turning to FIG. 5B, there is illustrated one example of the geometry of transistor 400a having source/drain regions 500a and a gate electrode 502a with a gate 503a, and which may be utilized to increase device operation. Now turning to FIG. 5C, there is illustrated one example of the geometry of transistor 400b having source/drain regions 500b and a gate electrode 502b with a gate 503b, and which may be utilized to decrease device operation.

As will be appreciated, assuming transistor X has degraded performance (slower) as compared to transistor Y, to compensate for this variation, the circuit design may be modified as follows: (1) transistor X channel length may be reduced, (2) transistor Y channel length may be increased, or (3) both (1) and (2) may be performed to match performance.

It will be understood that process 300 could be performed on a single or multiple locations of interest (or all structures of interest). In another embodiment, only those locations of interest critical to overall integrated circuit functionality may be selected for this process.

Further, the TPC method performed may also include some combination of all or a portion of the two embodiments described above. The order of steps or processing can be changed or varied form that described above. It will be understood that well known processes have not been described in detail and have been omitted for brevity. Although specific steps, structures and materials may have been described, the present disclosure may not limited to these specifics, and others may substituted as is well understood by those skilled in the art.

It may be advantageous to set forth definitions of certain words and phrases used throughout this patent document. The terms "include" and "comprise," as well as derivatives thereof, mean inclusion without limitation. The term "or" is inclusive, meaning and/or. The phrases "associated with" and "associated therewith," as well as derivatives thereof, mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An integrated circuit die comprising:
   a device structure formed at a pre-determined location on the die; and
   one or more dummy structures formed within a pre-defined effective thermal area surrounding a transistor structure and operable for adjusting temperature at the pre-determined location during a thermal anneal process based at least in part on a comparison of an estimated effective temperature at the pre-determined location and a desired temperature at the pre-determined location.

2. The integrated circuit die in accordance with claim 1 wherein the device structure comprises a transistor including source/drain regions, a gate electrode and a channel region.

3. The integrated circuit die in accordance with claim 2 wherein the one or more dummy structures has a structure that resembles another structure proximate a second transistor at the time of performance of the thermal anneal process.

4. The integrated circuit die in accordance with claim 2 wherein the one or more dummy structures has a structure that assists in achieving a temperature at the transistor that meets the desired temperature during the thermal anneal process.

5. The integrated circuit die in accordance with claim 1 wherein the one or more dummy structures provides a device pattern density around the device structure similar to a device pattern density around a second device structure.

6. The integrated circuit die in accordance with claim 5 wherein the device structure comprises a first transistor including source/drain regions, a gate electrode and a channel region, and the second device structure comprises a second transistor including source/drain regions, a gate electrode and a channel region, and wherein the first transistor and the second transistor have substantially same dimensions.

7. An integrated circuit die comprising:
   a first transistor structure formed at a first pre-determined location on the die, the first transistor structure having source/drain regions, a gate electrode and a channel region; and
   a second transistor structure formed at a second pre-determined location on the die, the second transistor structure having source/drain regions, a gate electrode and a channel region; and
   wherein at least one dimension of the second transistor structure is substantially different from a corresponding dimension of the first transistor structure and the performance of the first transistor structure and the performance of the second transistor structure is substantially uniform as a result of temperature variation at the first and second transistor structures during annealing.

8. The integrated circuit die in accordance with claim 7 wherein the at least one dimension of the second transistor is at least a one of: gate length and gate width.

9. The integrated circuit die in accordance with claim 7 wherein the at least one dimension of the second transistor comprises both gate length and gate width.

10. An integrated circuit die, comprising:
    an active device structure formed at a pre-determined location on the die, the active device structure comprising a first transistor including source/drain regions, a gate electrode and a channel region; and
    one or more dummy structures within a pre-defined effective thermal area surrounding the active device structure and operable for adjusting temperature at the pre-determined location during a thermal anneal process based at least in part on a comparison of an estimated effective temperature at the pre-determined location and a desired temperature at the pre-determined location.

11. The integrated circuit die in accordance with claim 10 wherein the one or more dummy structures comprise:
   a structure that resembles another structure proximate a second transistor at the time of performance of the thermal anneal process.

12. The integrated circuit die in accordance with claim 10 wherein the one or more dummy structures comprise:
   a structure that assists in achieving a temperature at the first transistor that meets the desired temperature during the thermal anneal process.

13. The integrated circuit die in accordance with claim 10 wherein the one or more dummy structures provides a device pattern density around the active device structure similar to a device pattern density around a second active device structure.

14. The integrated circuit die in accordance with claim 13 wherein the second active device structure comprises a second transistor including source/drain regions, a gate electrode and a channel region, and the first transistor and the second transistor have substantially same dimensions.

15. An integrated circuit die comprising:
   a device structure formed at a pre-determined location on the die; and
   one or more dummy structures formed within a pre-defined effective thermal area surrounding the device structure and operable for adjusting temperature at the pre-determined location during a thermal anneal process based at least in part on a comparison of an estimated effective temperature at the pre-determined location and a desired temperature at the pre-determined location.

16. The integrated circuit die in accordance with claim 15 wherein the device structure comprises a transistor including source/drain regions, a gate electrode and a channel region.

17. The integrated circuit die in accordance with claim 16 wherein the one or more dummy structures has a structure that resembles another structure proximate a second transistor at the time of performance of the thermal anneal process.

18. The integrated circuit die in accordance with claim 16 wherein the one or more dummy structures has a structure that assists in achieving a temperature at the transistor that meets the desired temperature during the thermal anneal process.

19. The integrated circuit die in accordance with claim 15 wherein the one or more dummy structures provides a device pattern density around the device structure similar to a device pattern density around a second device structure.

20. The integrated circuit die in accordance with claim 19 wherein the device structure comprises a first transistor including source/drain regions, a gate electrode and a channel region, and the second device structure comprises a second transistor including source/drain regions, a gate electrode and a channel region, and wherein the first transistor and the second transistor have substantially same dimensions.

* * * * *